(12) United States Patent
Zang et al.

(10) Patent No.: US 9,691,787 B2
(45) Date of Patent: Jun. 27, 2017

(54) CO-FABRICATED BULK DEVICES AND SEMICONDUCTOR-ON-INSULATOR DEVICES

(71) Applicant: GLOBALFOUNDRIES Inc., Grand Caymay (KY)

(72) Inventors: Hui Zang, Guilderland, NY (US); Bingwu Liu, Ballston Spa, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/878,332

(22) Filed: Oct. 8, 2015

(65) Prior Publication Data

US 2017/0104011 A1 Apr. 13, 2017

(51) Int. Cl.
*H01L 27/12* (2006.01)
*H01L 21/84* (2006.01)
*H01L 21/8234* (2006.01)

(52) U.S. Cl.
CPC ...... *H01L 27/1207* (2013.01); *H01L 21/8234* (2013.01); *H01L 21/84* (2013.01)

(58) Field of Classification Search
CPC ............. H01L 21/84; H01L 21/7624; H01L 21/76283; H01L 27/1203; H01L 27/1207; H01L 27/1211
See application file for complete search history.

(56) References Cited

U.S. PATENT DOCUMENTS 7,049,661 B2 * 5/2006 Yamada ............. H01L 29/7841
257/347
8,058,158 B2 * 11/2011 Bourdelle ............ H01L 21/187
257/506

* cited by examiner

*Primary Examiner* — Jose R Diaz
(74) *Attorney, Agent, or Firm* — Wayne F. Reinke, Esq.; Heslin Rothenberg Farley & Mesiti P.C.

(57) ABSTRACT

Bulk semiconductor devices are co-fabricated on a bulk semiconductor substrate with SOI devices. The SOI initially covers the entire substrate and is then removed from the bulk device region. The bulk device region has a thicker dielectric on the substrate than the SOI region. The regions are separated by isolation material, and may or may not be co-planar.

15 Claims, 13 Drawing Sheets

CO-FABRICATED BULK DEVICES AND SEMICONDUCTOR-ON-INSULATOR DEVICES

BACKGROUND OF THE INVENTION

Technical Field

The present invention generally relates to co-fabricated bulk and semiconductor-on-insulator (SOI) devices. More particularly, the present invention relates to forming different dielectric thicknesses for co-fabricated bulk and SOI devices.

Background Information

Co-fabricating bulk semiconductor devices and SOI devices brings many process challenges, particularly due to the resulting non-planar topography. Such a topography can affect downstream processes, for example, contact formation. In addition, a non-planar topography may require an additional mask.

Thus, a need continues to exist for a way to co-fabricate bulk semiconductor and SOI devices, while avoiding the addition of a mask.

SUMMARY OF THE INVENTION

The shortcomings of the prior art are overcome and additional advantages are provided through the provision, in one aspect, of a method of forming different dielectric thicknesses for co-fabricated bulk and SOI devices. The method includes providing a starting semiconductor structure, the structure including a bulk semiconductor substrate with a blanket dielectric layer thereover and a blanket layer of semiconductor material over the dielectric layer. The method further includes removing a common portion of both blanket layers, exposing an area of the substrate, forming a layer of dielectric material over the area of the substrate, and removing at least one portion of the structure adjacent the area of the substrate with the layer of dielectric material thereover. The method further includes forming at least one layer of isolation material in one or more openings formed by removing the at least one portion of the structure, the at least one layer of isolation material being co-planar with a top surface of the remaining blanket layer of semiconductor material, and forming a top blanket layer of dielectric material over the structure, resulting in a thicker dielectric layer above the area of the substrate.

In accordance with another aspect, a semiconductor structure is provided. The structure includes a bulk semiconductor substrate, at least one first dielectric layer over a first portion of the substrate, and a semiconductor layer over the first dielectric layer, creating a semiconductor-on-insulator (SOI) region. The structure further includes at least one second dielectric layer over a second portion of the substrate, creating a bulk semiconductor device region horizontally adjacent the SOI region. The at least one second dielectric layer is thicker than the at least one first dielectric layer, and at least one layer of isolation material physically separates the SOI region from the bulk semiconductor device region down to the bulk semiconductor substrate. The bulk region further includes a layer of semiconductor material above the second portion of the substrate under the at least one second dielectric layer, and the SOI region and the bulk region are co-planar.

These, and other objects, features and advantages of this invention will become apparent from the following detailed description of the various aspects of the invention taken in conjunction with the accompanying drawings.

DETAILED DESCRIPTION OF THE INVENTION

Figure 1:
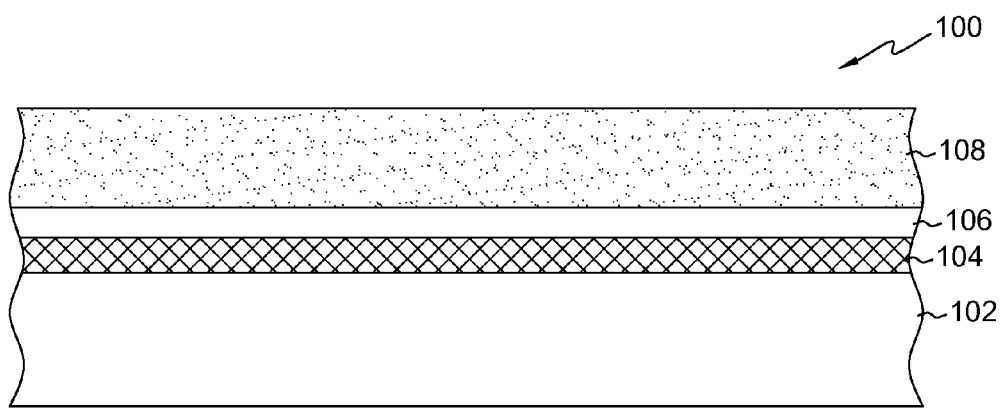
FIG. 1 is a cross-sectional view of one example of a starting semiconductor structure, the structure including a semiconductor substrate, a dielectric layer above the substrate, another semiconductor layer above the dielectric layer, and a hard mask layer above the second dielectric layer, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

As used herein, unless otherwise specified, the term "about" used with a value, such as measurement, size, etc., means a possible variation of up to plus or minus three percent of the value.

Reference is made below to the drawings, which are not drawn to scale for ease of understanding, wherein the same reference numbers are used throughout different figures to designate the same or similar components.

FIG. 1 is a cross-sectional view of one example of a starting semiconductor structure 100, the structure including a semiconductor substrate 102, a dielectric layer 104 above the substrate, another semiconductor layer 106 above the dielectric layer, and a hard mask layer 108 above the second dielectric layer, in accordance with one or more aspects of the present invention.

The starting structure may be conventionally fabricated, for example, using known processes and techniques. Further, unless noted otherwise, conventional processes and techniques may be used to achieve individual steps of the fabrication process of the present invention. However, although only a portion of the overall structure is shown for simplicity, it will be understood that, in practice, many such structures are typically included on the same bulk substrate.

In one example, substrate 102 may include any silicon-containing substrate including, but not limited to, silicon (Si), single crystal silicon, polycrystalline Si, amorphous Si, silicon-on-nothing (SON), silicon-on-insulator (SOI) or silicon-on-replacement insulator (SRI) or silicon germanium substrates and the like. Substrate 102 may in addition or instead include various isolations, dopings and/or device features. The substrate may include other suitable elementary semiconductors, such as, for example, germanium (Ge) in crystal, a compound semiconductor, such as silicon carbide (SiC), gallium arsenide (GaAs), gallium phosphide (GaP), indium phosphide (InP), indium arsenide (InAs), and/or indium antimonide (InSb) or combinations thereof; an alloy semiconductor including GaAsP, AlInAs, GaInAs, GaInP, or GaInAsP or combinations thereof.

Figure 2:
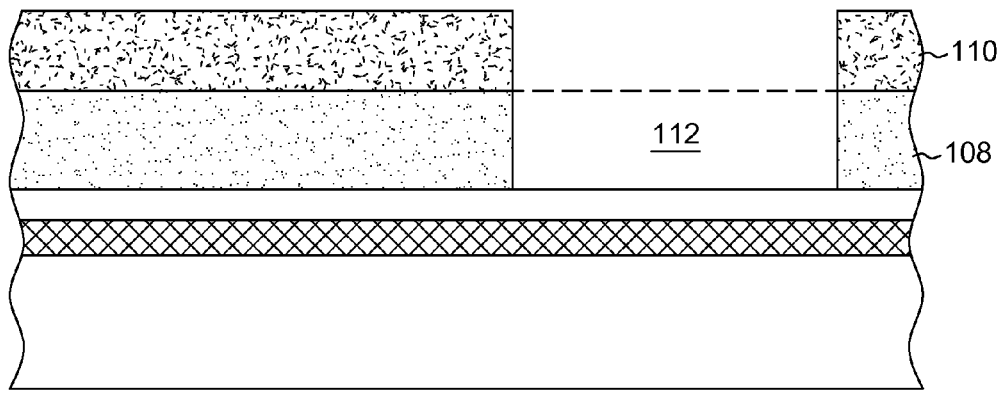
FIG. 2 depicts one example of the structure of FIG. 1 after forming a layer of lithographic blocking material (e.g., photoresist), and patterning to remove a portion of the hard mask layer, creating a trench, in accordance with one or more aspects of the present invention.

FIG. 2 depicts one example of the structure of FIG. 1 after forming a layer 110 of lithographic blocking material (e.g., photoresist), and patterning to remove a portion 112 of hard mask layer 108, in accordance with one or more aspects of the present invention. In one example, the hard mask layer may include, for example, silicone nitride.

Figure 3:
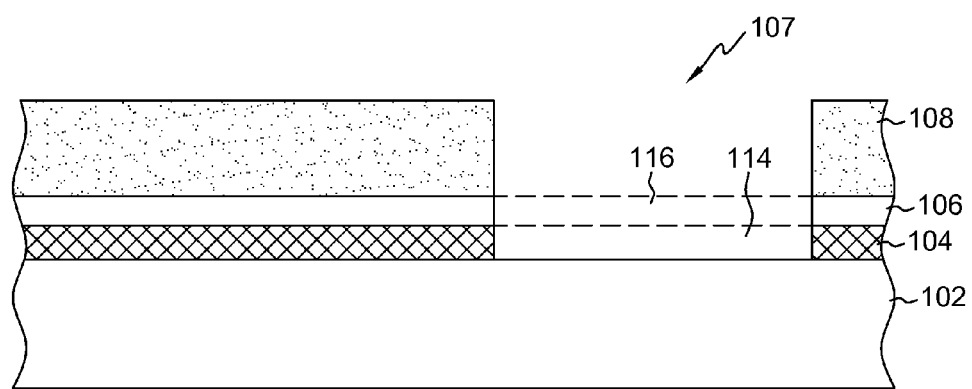
FIG. 3 depicts one example of the structure of FIG. 2 after removal of the layer of lithographic blocking material and removal of portions of the dielectric layer, respectively, at a bottom of the trench, exposing the substrate, in accordance with one or more aspects of the present invention.

FIG. 3 depicts one example of the structure of FIG. 2 after removal of the layer of lithographic blocking material (110, FIG. 2) and removal of a portion 114 of dielectric layer 104 directly under the removed portion of hard mask layer 108, exposing substrate 102 and resulting in a trench 107, in accordance with one or more aspects of the present invention. In one example, removal of portion 114 may be accomplished using conventional processes and techniques. Note that while a substrate recess as part of forming the trench is not advisable, oxidation of the substrate in the trench may optionally be performed.

Figure 4:
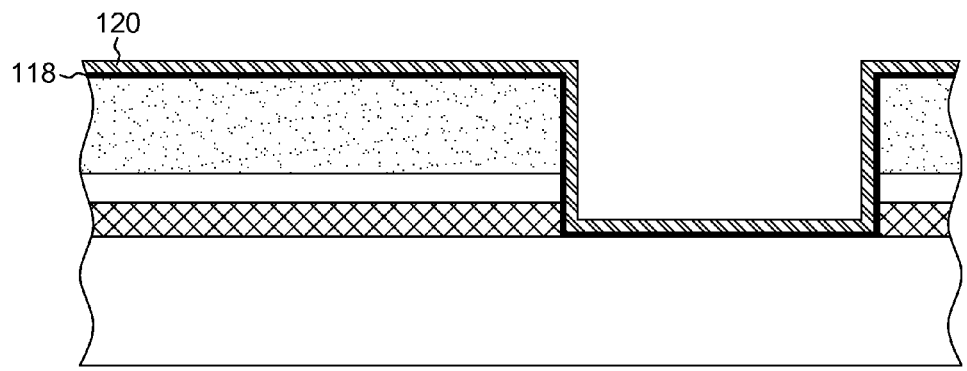
FIG. 4 depicts one example of the structure of FIG. 3 after forming a conformal layer of dielectric material (e.g., a high-k dielectric) over the structure, and optionally forming a conformal layer of a capping material (e.g., titanium nitride) to protect the dielectric layer, in accordance with one or more aspects of the present invention.

FIG. 4 depicts one example of the structure of FIG. 3 after forming a conformal layer 118 of dielectric material (e.g., a high-k dielectric or silicon dioxide) over the structure, and optionally forming a conformal layer 120 of a capping material (e.g., titanium nitride), in accordance with one or more aspects of the present invention. In one example, the conformal dielectric layer and, where present, the conformal capping material layer may be formed using, for example, conventional processes and techniques. As used herein, "high-k dielectric" refers to a dielectric with a dielectric constant above 3.9 (dielectric constant of silicon dioxide).

Figure 5:
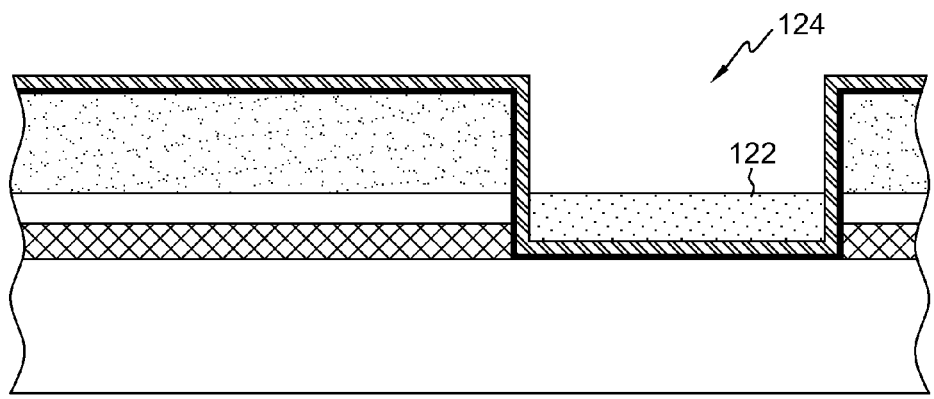
FIG. 5 depicts one example of the structure of FIG. 4 after forming an organic dielectric layer (ODL) at a bottom portion of the trench, the ODL covering the dielectric layer and capping layer (where present), in accordance with one or more aspects of the present invention.

FIG. 5 depicts one example of the structure of FIG. 4 after forming an organic dielectric layer (ODL) 122 at a bottom portion of opening 124, in accordance with one or more aspects of the present invention. In one example, the ODL is initially a blanket layer formed, for example, using a spin-on process.

Figure 6:
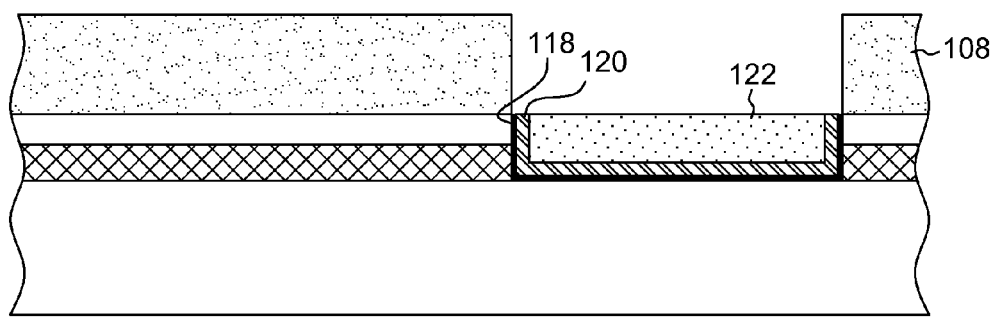
FIG. 6 depicts one example of the structure of FIG. 5 after removal of a capping material layer (where present) and the dielectric layer everywhere not covered by the ODL, in accordance with one or more aspects of the present invention.

FIG. 6 depicts one example of the structure of FIG. 5 after removal of capping material layer 120 (where present) and dielectric layer 118 everywhere not covered by the ODL 122, in accordance with one or more aspects of the present invention. In one example, removal of the conformal dielectric and conformal capping material layers everywhere not covered by the ODL may be accomplished using, for example, conventional processes and techniques.

Figure 7:
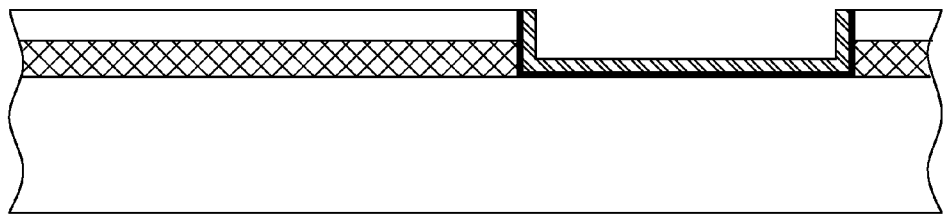
FIG. 7 depicts one example of the structure of FIG. 6 after removal of the ODL and the hard mask layer, in accordance with one or more aspects of the present invention.

FIG. 7 depicts one example of the structure of FIG. 6 after removal of the ODL (122, FIG. 6) and the hard mask layer (108, FIG. 6), in accordance with one or more aspects of the present invention. In one example, removal of the ODL and the hard mask layer may be accomplished using, for example, conventional processes and techniques.

Figure 8:
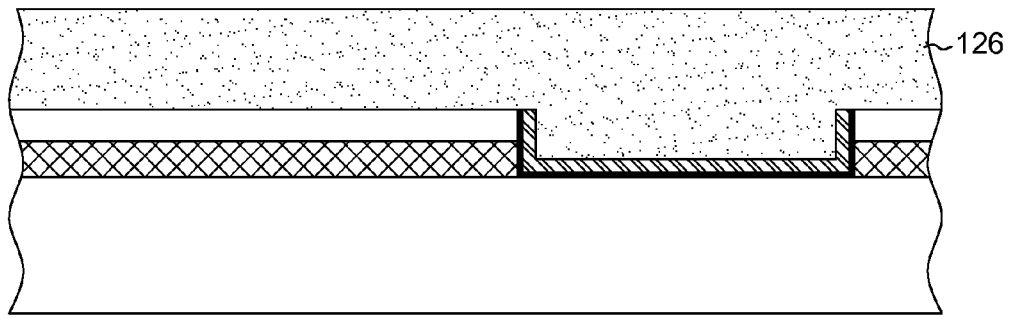
FIG. 8 depicts one example of the structure of FIG. 7 after forming a blanket conformal hard mask layer and planarizing the same, in accordance with one or more aspects of the present invention.

FIG. 8 depicts one example of the structure of FIG. 7 after forming a blanket conformal hard mask layer 126 and planarizing the same, in accordance with one or more aspects of the present invention. In one example, formation of the blanket conformal hard mask layer may be accomplished using, for example, conventional processes and techniques, and the planarizing may be accomplished using, for example, a chemical-mechanical polishing process.

Figure 9:
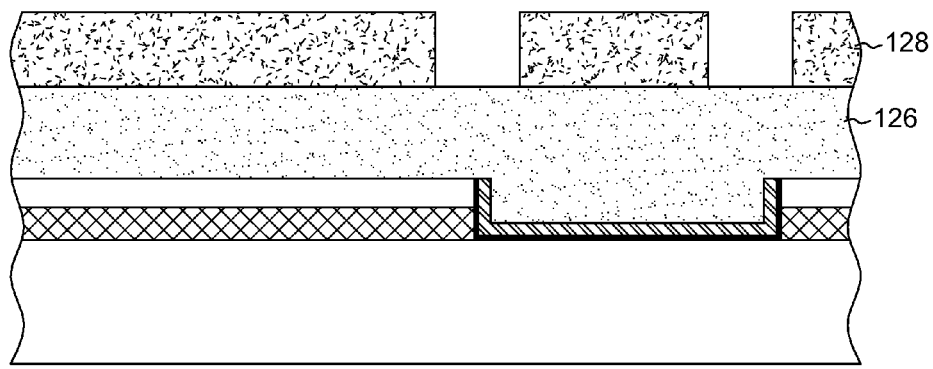
FIG. 9 depicts one example of the structure of FIG. 8 after formation and patterning of a lithographic blocking layer over a planarized hard mask layer, in accordance with one or more aspects of the present invention.

FIG. 9 depicts one example of the structure of FIG. 8 after formation and patterning of a lithographic blocking layer 128 (e.g., photoresist) over planarized hard mask layer 126, in accordance with one or more aspects of the present invention. In one example, formation and patterning of the lithographic blocking layer may be accomplished using, for example, conventional processes and techniques.

Figure 10:
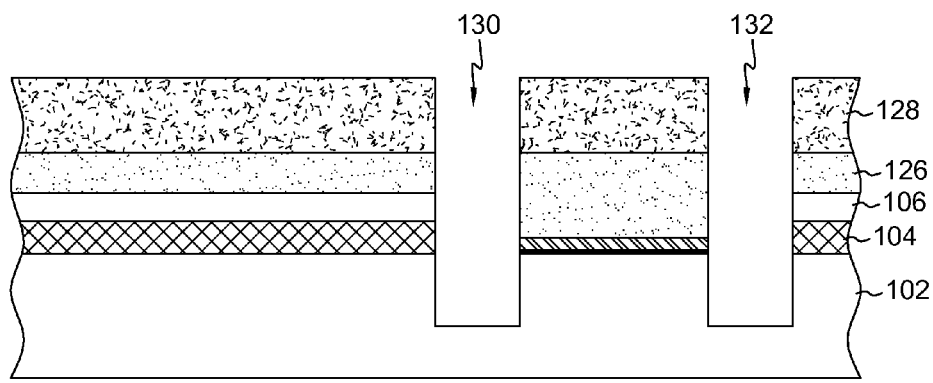
FIG. 10 depicts one example of the structure of FIG. 9 after removal of the various layers down into the substrate, creating openings, in accordance with one or more aspects of the present invention.

FIG. 10 depicts one example of the structure of FIG. 9 after removal of the various layers down into the substrate 102, creating openings 130 and 132, in accordance with one or more aspects of the present invention. In one example, removal of the various layers to create the openings may be accomplished using, for example, conventional processes and techniques (e.g., conventional etching processes).

Figure 11:
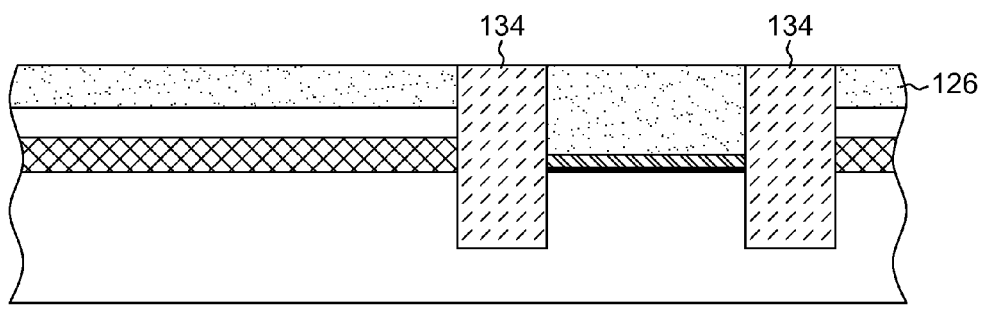
FIG. 11 depicts one example of the structure of FIG. 10 after removal of lithographic blocking layer, filling of the openings with a dielectric material and planarizing down to hard mask layer, in accordance with one or more aspects of the present invention.

FIG. 11 depicts one example of the structure of FIG. 10 after removal of lithographic blocking layer (128, FIG. 10), filling of openings 130 and 132 (FIG. 10) with isolation material 134 (e.g., a shallow trench isolation material) and planarizing down to hard mask layer 126, in accordance with one or more aspects of the present invention. In one example, removal of the lithographic blocking layer and filling the openings may be accomplished using, for example, conventional processes and techniques. In one example, the planarizing may be accomplished using, for example, a chemical-mechanical polishing process.

Figure 12:
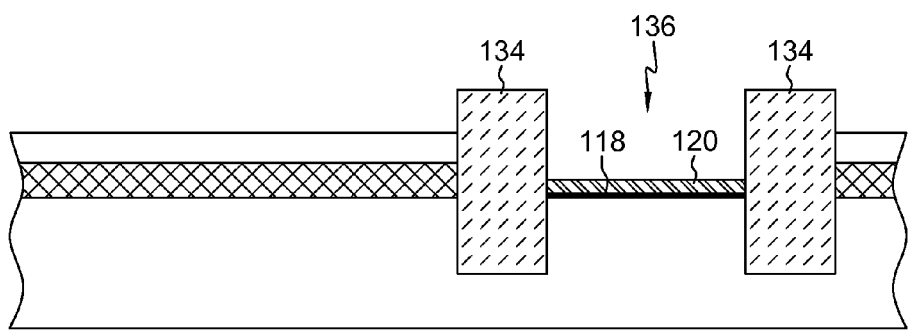
FIG. 12 depicts one example of the structure of FIG. 11 after removal of the hard mask layer, leaving an opening between the two areas of dielectric material, the capping and dielectric layers remaining at a bottom of the opening, in accordance with one or more aspects of the present invention.

FIG. 12 depicts one example of the structure of FIG. 11 after removal of the hard mask layer (126, FIG. 11), leaving opening 136 between the two areas of isolation material 134, the capping 120 and dielectric 118 layers remaining at a bottom of the opening, in accordance with one or more aspects of the present invention. In one example, removal of the hard mask layer may be accomplished using, for example, conventional processes and techniques.

Figure 13:
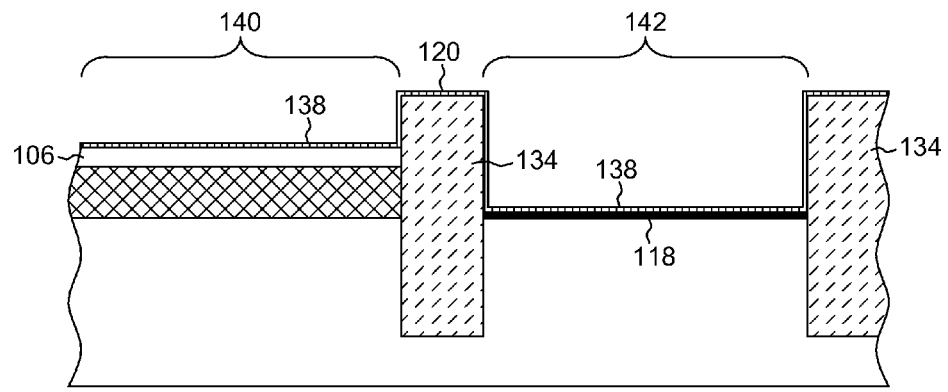
FIG. 13 depicts one example of the structure of FIG. 12 after planarizing the dielectric material down to a remainder of the semiconductor layer, removing the capping layer, where present, and forming a blanket conformal dielectric layer (e.g., a high-k dielectric), effectively creating an SOI (semiconductor-on-insulator) area with just a dielectric layer, and a bulk area with the dielectric layers, created without using a mask, in accordance with one or more aspects of the present invention.

FIG. 13 depicts one example of the structure of FIG. 12 after removing the capping layer (120, FIG. 12), where present, and forming a blanket conformal dielectric layer 138 (e.g., a high-k dielectric), effectively creating an SOI area 140 with just dielectric layer 138, and bulk area 142 with dielectric layers 118 and 138, created without using a mask, in accordance with one or more aspects of the present invention. In one example, removing the capping layer and forming the blanket conformal dielectric layer may be accomplished using, for example, conventional processes and techniques.

Figure 14:
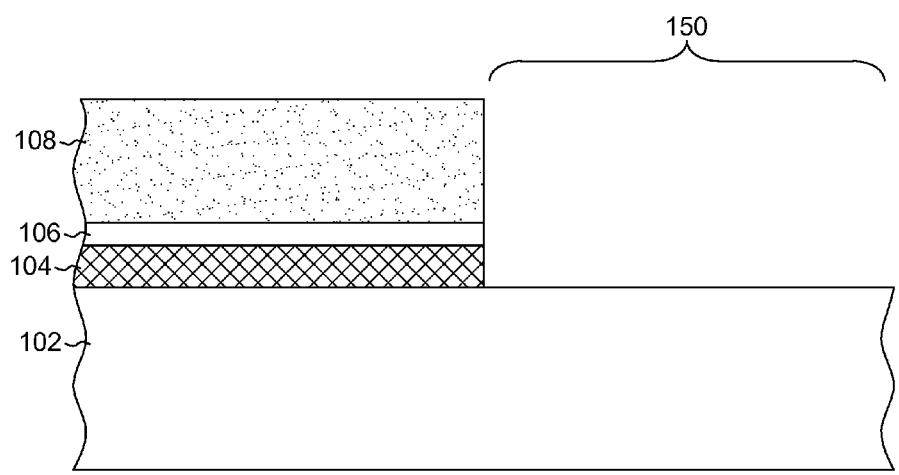
FIG. 14 depicts one example of the starting structure of FIG. 1 after removing the layers of dielectric, the semiconductor and hard mask, from a right side of the structure, exposing the substrate in a first area, in accordance with one or more aspects of the present invention.

FIG. 14 depicts one example of the starting structure of FIG. 1 after removing the layers of dielectric 104, semiconductor 106 and hard mask 108, from a right side of the structure, exposing substrate 102 in a first area 150, in accordance with one or more aspects of the present invention. In one example, removing the various layers from the right side of the structure to expose the substrate may be accomplished using, for example, conventional processes and techniques.

Figure 15:
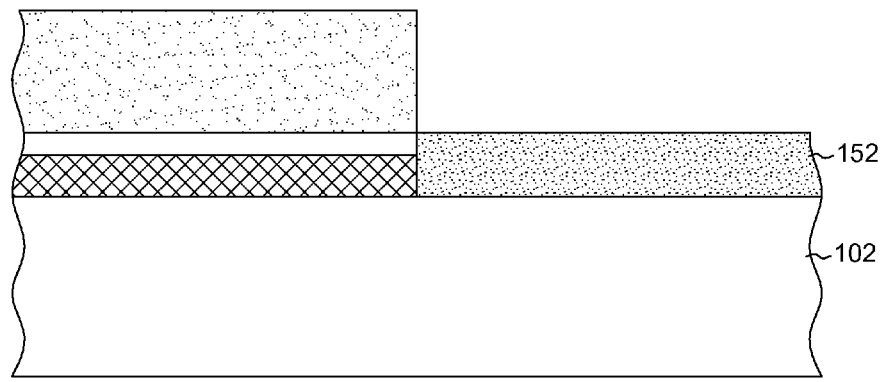
FIG. 15 depicts one example of the structure of FIG. 14 after formation of a layer of undoped epitaxial semiconductor material on the exposed substrate, in accordance with one or more aspects of the present invention.

FIG. 15 depicts one example of the structure of FIG. 14 after formation of a layer 152 of undoped epitaxial semiconductor material on the exposed substrate, in accordance with one or more aspects of the present invention. In one example, forming the layer of undoped epitaxial semiconductor material (e.g., epitaxial silicon) may be formed, for example, by growing the same with the substrate as a seed.

Figure 16:
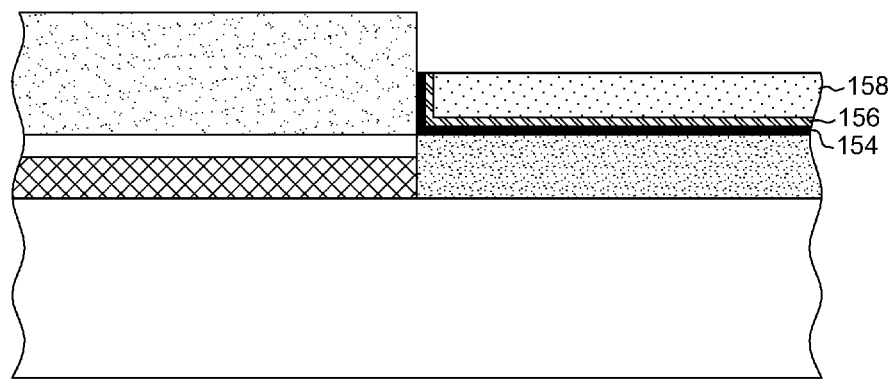
FIG. 16 depicts one example of the structure of FIG. 15 after formation of a dielectric layer, optional capping layer, ODL, and removal of the dielectric and capping layers everywhere except that covered by the ODL, similar to FIG. 6, in accordance with one or more aspects of the present invention.

FIG. 16 depicts one example of the structure of FIG. 15 after formation of dielectric layer 154, optional capping layer 156, ODL 158, and removal of the dielectric and capping layers everywhere except that covered by the ODL, similar to FIG. 6, in accordance with one or more aspects of the present invention. In one example, formation of the dielectric and optional capping layers and removal of the uncovered portions of the dielectric and capping layers may be accomplished using, for example, conventional processes and techniques.

Figure 17:
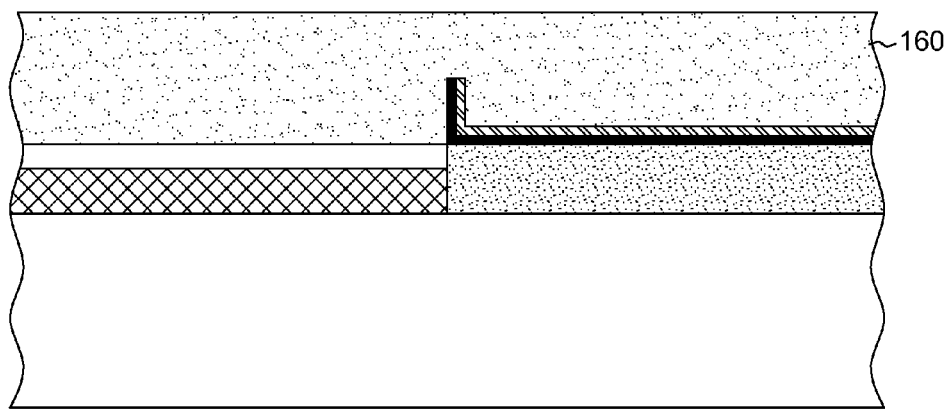
FIG. 17 depicts one example of the structure of FIG. 16 after removal of the ODL, formation of a blanket conformal hard mask layer and planarization thereof, in accordance with one or more aspects of the present invention.

FIG. 17 depicts one example of the structure of FIG. 16 after removal of the ODL, formation of a blanket conformal hard mask layer 160 and planarization thereof, in accordance with one or more aspects of the present invention. In one example, removal of the ODL and formation of the blanket conformal hard mask layer may be accomplished using, for example, conventional processes and techniques. In one example, the planarizing may be accomplished using, for example, a chemical-mechanical polishing process.

Figure 18:
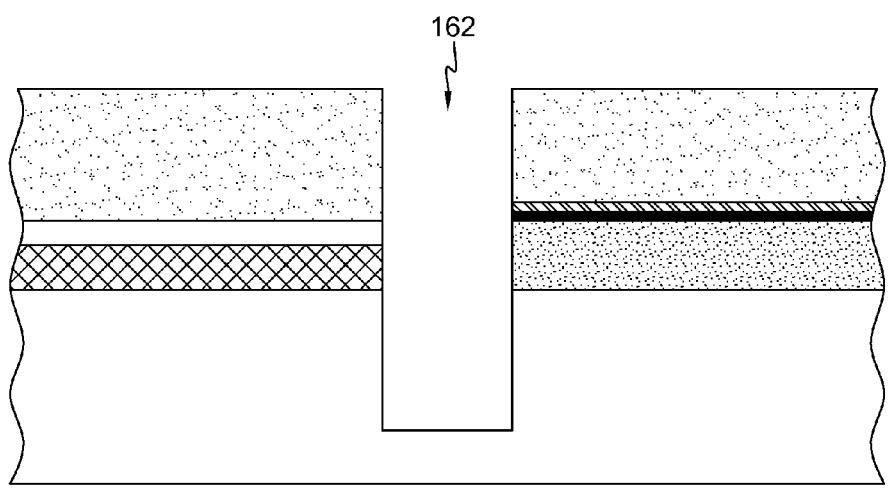
FIG. 18 depicts one example of the structure of FIG. 17 after removal of the various layers in a center portion of the structure down into the substrate, creating an opening, in accordance with one or more aspects of the present invention.

FIG. 18 depicts one example of the structure of FIG. 17 after removal of the various layers in a center portion of the structure down into substrate 102, creating opening 162, in accordance with one or more aspects of the present invention. In one example, removal of the various layers to create the center opening may be accomplished using, for example, conventional processes and techniques.

Figure 19:
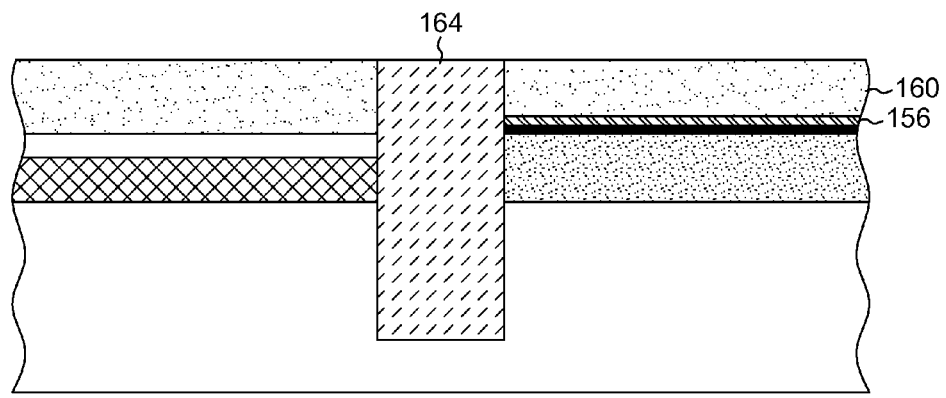
FIG. 19 depicts one example of the structure of FIG. 18 after filling the opening with a dielectric material and planarizing, in accordance with one or more aspects of the present invention.

FIG. 19 depicts one example of the structure of FIG. 18 after filling the opening (162, FIG. 18) with a dielectric material 164 and planarizing, in accordance with one or more aspects of the present invention. In one example, filling the center opening may be accomplished using, for example, conventional processes and techniques. In one example, the planarizing may be accomplished using, for example, a chemical-mechanical polishing process.

Figure 20:
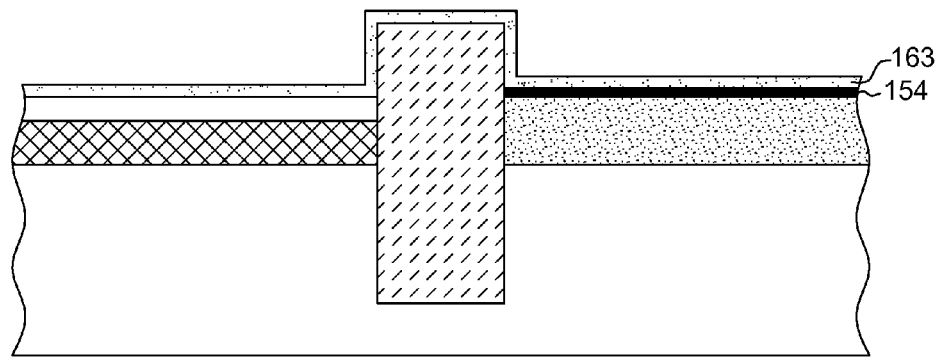
FIG. 20 depicts one example of the structure of FIG. 19 after removal of the remaining hard mask layer, in accordance with one or more aspects of the present invention.

FIG. 20 depicts one example of the structure of FIG. 19 after removal of the remaining hard mask layer (160, FIG. 19) and dielectric layer 156, followed by formation of dielectric layer 163 (e.g., high-k dielectric) over the structure, in accordance with one or more aspects of the present invention. In one example, removal of the remaining hard mask layer may be accomplished using, for example, conventional processes and techniques.

Figure 21:
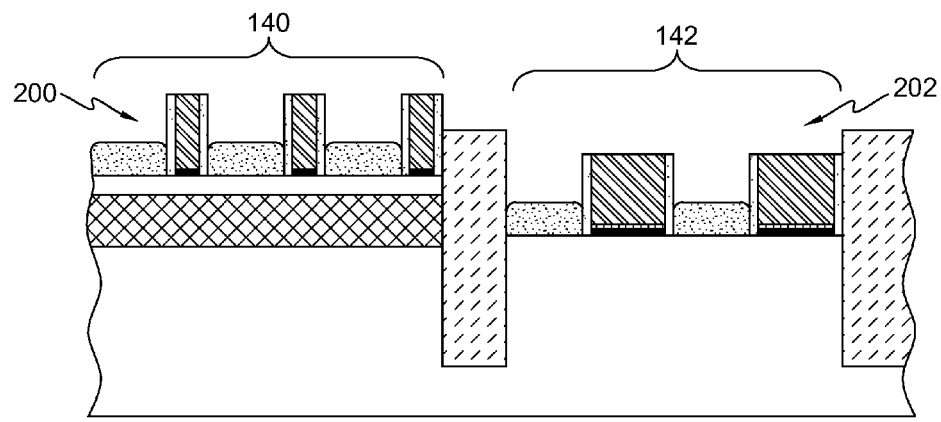
FIG. 21 depicts one example of the structure of FIG. 13 after fabricating semiconductor device(s) of a first type on the SOI region and fabricating semiconductor device(s) of a second type over the bulk region, in accordance with one or more aspects of the present invention.

FIG. 21 depicts one example of the structure of FIG. 13 after fabricating semiconductor device(s) of a first type 200 on the SOI region 140 and fabricating semiconductor device(s) of a second type 202 over the bulk region 142, in accordance with one or more aspects of the present invention.

In one example, the first and second types of semiconductor devices are conventional semiconductor devices fabricated, for example, using conventional fabrication processes and techniques. For example, devices in the SOI region 140 may include, for example, logic devices (e.g., FinFETs), and the devices in the bulk region 142 may include, for example, memory devices (e.g., flash memory).

Figure 22:
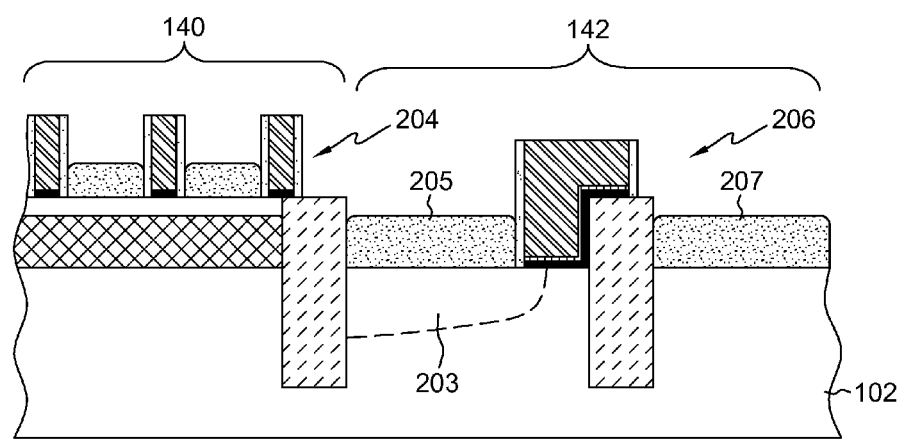
FIG. 22 depicts one example of the structure of FIG. 13 after fabricating semiconductor device(s) of a first type on the SOI region and fabricating LDMOS device(s) on the bulk region, in accordance with one or more aspects of the present invention.

FIG. 22 depicts one example of the structure of FIG. 13 after fabricating semiconductor device(s) of a first type 204 on the SOI region 140 and fabricating LDMOS (high voltage MOSFET) device(s) 206 on the bulk region 142. Also shown is well 203 under epitaxial material 205, in accordance with one or more aspects of the present invention. In one example, the epitaxial material may be of n-type where the well is n type, the epitaxial material 207 is n+ type, and the substrate is p-type.

In one example, the SOI devices and LDMOS devices may be fabricated, for example, using conventional processes and techniques.

Figure 23:
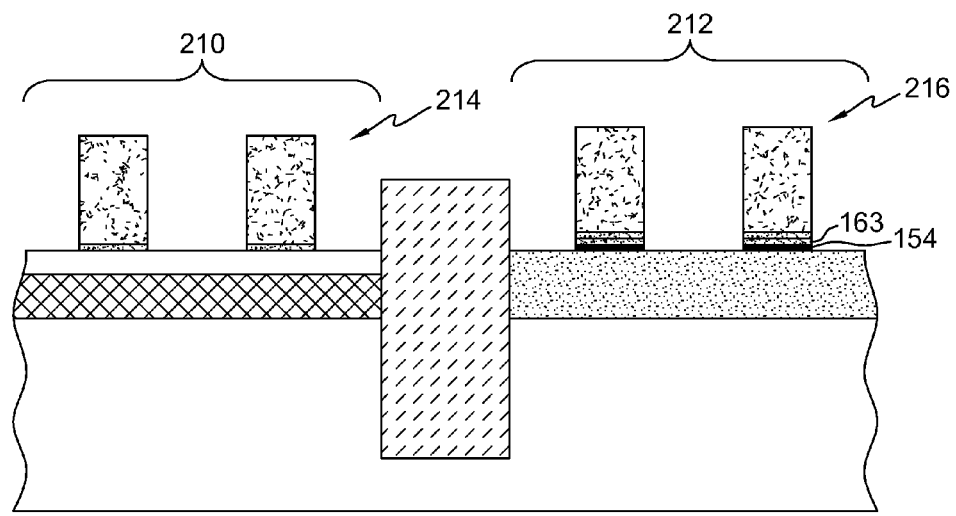
FIG. 23 depicts one example of the structure of FIG. 20 after forming a second layer of dielectric material over the bulk region, and fabricating transistors on the SOI region and flash memory on the bulk region, in accordance with one or more aspects of the present invention.

FIG. 23 depicts one example of the structure of FIG. 20 after removal of any capping layer present and any top dielectric layer on the SOI region 210 and the bulk region (154, FIG. 20) 212, and fabricating logic devices (e.g., transistors) 214 on the SOI region and memory devices 216 (e.g., flash memory) on the bulk region, in accordance with one or more aspects of the present invention. Note that the co-fabricated logic and memory devices are achieved without an additional mask for different dielectric thicknesses. Note also, the tri-layer of dielectric below the gates of the bulk region versus the single layer in the SOI region.

In one example, the dielectric material and capping layer (where present) are removed, and the transistors and flash memory fabricated, using conventional processes and techniques.

Figure 24:
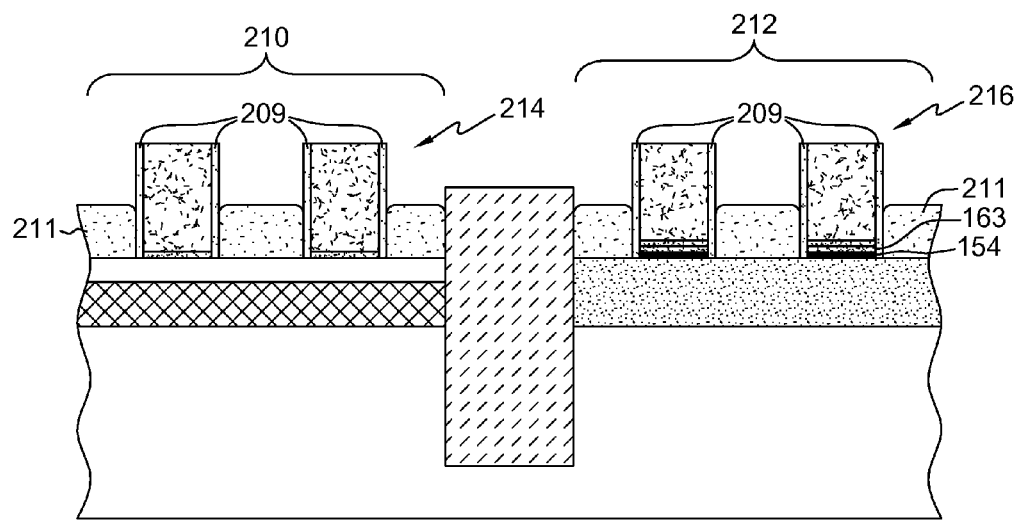
FIG. 24 depicts one example of the structure of FIG. 23 after forming spacers and epitaxial material for the sources and drains in both regions, in accordance with one or more aspects of the present invention.

FIG. 24 depicts one example of the structure of FIG. 23 after forming spacers 209 and epitaxial material 211 for the sources and drains in both regions, in accordance with one or more aspects of the present invention.

Figure 25:
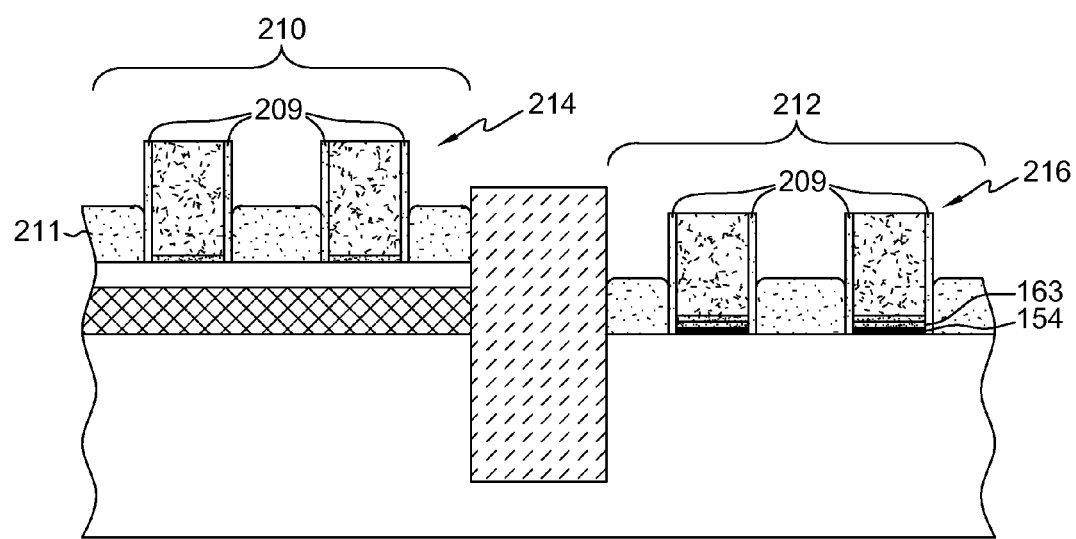
FIG. 25 depicts another example of the structure of FIG. 21, except that gates on the bulk region land on a tri-layer of dielectric, for example, silicon nitride sandwiched between two layers of high-k dielectric, in accordance with one or more aspects of the present invention.

FIG. 25 depicts another example of the structure of FIG. 21, except that gates on the bulk region land on a tri-layer of dielectric, for example, silicon nitride sandwiched between two layers of high-k dielectric, in accordance with one or more aspects of the present invention.

In a first aspect, disclosed above is a method of forming different dielectric thicknesses for co-fabricated bulk and SOI devices. The method includes providing a starting semiconductor structure, the structure including a bulk semiconductor substrate with a blanket dielectric layer thereover and a blanket layer of semiconductor material over the dielectric layer. The method further includes removing a common portion of both blanket layers, exposing an area of the substrate, forming a layer of dielectric material over the area of the substrate, and removing portion(s) of the structure adjacent the area of the substrate with the dielectric layer thereover. The method further includes forming layer(s) of isolation material in the opening(s) formed by removing the portion(s) of the structure, the layer(s) of isolation material being co-planar with a top surface of the remaining blanket layer of semiconductor material, and forming a top blanket layer of dielectric material over the structure, resulting in a thicker dielectric layer above the area of the substrate (as compared to outside the area of the substrate).

In one example, the method of the first aspect may further include, for example, forming first semiconductor device(s)

over the substrate, and forming second semiconductor device(s) over the remaining blanket layer of semiconductor material.

In one example, the second semiconductor device(s) may include, for example, laterally diffused metal oxide semiconductor (LDMOS) detector(s). In another example, the second semiconductor device(s) may include, for example, transistor(s), the transistor(s) may include, for example, work-function material in a gate structure.

In one example, the method of the first aspect may further include, for example, forming a protective layer over the layer of dielectric material prior to removing the portion(s).

In one example, the method of the first aspect may further include, for example, forming a second blanket dielectric layer over the structure after the removing, and forming a layer of dielectric material over the second blanket dielectric layer above the area of the substrate.

In one example, the method of the first aspect may further include, for example, after removing the common portion and before forming the layer of dielectric material, forming a layer of semiconductor material on the area of the substrate such that a top surface of the structure is planar, and forming the layer of dielectric material may include, for example, forming the layer of dielectric material on the layer of semiconductor material.

In one example, forming the layer of semiconductor material after removing the common portion and before forming the layer of dielectric material may include, for example, forming epitaxial semiconductor material.

In one example, the method may further include, for example, forming a protective layer over the layer of dielectric material prior to removing the portion(s).

In a second aspect, disclosed above is a semiconductor structure. The structure includes a bulk semiconductor substrate, first dielectric layer(s) over a first portion of the substrate, and a semiconductor layer over the first dielectric layer, creating a semiconductor-on-insulator (SOI) region. The structure further includes second dielectric layer(s) over a second portion of the substrate, creating a bulk semiconductor device region. The second dielectric layer(s) is thicker than the first dielectric layer(s), and layer(s) of isolation material separates the SOI region and the bulk semiconductor device region.

In one example, the SOI region in the semiconductor structure of the second aspect may have, for example, a greater height than the bulk region.

In one example, the bulk region in the semiconductor structure of the second aspect may further include, for example, a layer of semiconductor material above the second portion of the substrate under the second dielectric layer(s), and the SOI region and the bulk region are co-planar.

In one example, the layer of semiconductor material in the bulk region may include, for example, epitaxial semiconductor material.

In one example, the semiconductor structure of the second aspect may further include, for example, a first type of semiconductor device(s) in the SOI region, and a second type of semiconductor device(s) in the bulk semiconductor device region.

In one example, the second type of semiconductor device(s) may include, for example, laterally diffused metal oxide semiconductor (LDMOS) detector(s).

In one example, the second type of semiconductor device(s) may include, for example, transistor(s), the transistor(s) including work-function material in a gate structure.

In one example, the semiconductor structure of the second aspect may further include, for example, a sacrificial capping layer over the second dielectric layer(s).

In one example, the sacrificial capping layer may include, for example, titanium nitride.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A semiconductor structure, comprising:
   a bulk semiconductor substrate;
   at least one first dielectric layer over a first portion of the substrate;
   a semiconductor layer over the first dielectric layer, creating a semiconductor-on-insulator (SOI) region;
   at least one second dielectric layer over a second portion of the substrate, creating a bulk semiconductor device region horizontally adjacent the SOI region, wherein the at least one second dielectric layer is thicker than the at least one first dielectric layer; and
   at least one layer of isolation material physically separating the SOI region from the bulk semiconductor device region down to the bulk semiconductor substrate;
   wherein the bulk region further comprises a layer of semiconductor material above the second portion of the substrate under the at least one second dielectric layer, and wherein the SOI region and the bulk region are co-planar.

2. The semiconductor structure of claim 1, wherein the layer of semiconductor material in the bulk region comprises epitaxial semiconductor material.

3. The semiconductor structure of claim 1, further comprising:
   at least one first type of semiconductor device in the SOI region; and
   at least one second type of semiconductor device in the bulk semiconductor device region;
   wherein the at least one second type of semiconductor device comprises at least one laterally diffused metal oxide semiconductor (LDMOS) detector.

4. The semiconductor structure of claim 1, further comprising:
   at least one first type of semiconductor device in the SOI region; and
   at least one second type of semiconductor device in the bulk semiconductor device region;
   wherein the at least one second type of semiconductor device comprises at least one transistor, the at least one transistor comprising work-function material in a gate structure.

5. The semiconductor structure of claim 1, further comprising a sacrificial capping layer over the at least one second dielectric layer.

6. The semiconductor structure of claim 5, wherein the sacrificial capping layer comprises titanium nitride.

7. A method, comprising:
   providing a starting semiconductor structure, the structure comprising a bulk semiconductor substrate with a blanket dielectric layer thereover and a blanket layer of semiconductor material over the dielectric layer;
   removing a common portion of both blanket layers, exposing an area of the substrate;
   forming a layer of dielectric material over the area of the substrate;

removing at least one portion of the structure adjacent the area of the substrate with the layer of dielectric material thereover;

forming at least one layer of isolation material in one or more openings formed by the removing, the at least one layer of isolation material being co-planar with a top surface of the remaining blanket layer of semiconductor material; and forming a top blanket layer of dielectric material over the structure, resulting in a thicker dielectric layer above the area of the substrate.

8. The method of claim 7, further comprising:

forming at least one first type of semiconductor device over the substrate; and forming at least one second type of semiconductor device over the remaining blanket layer of semiconductor material.

9. The method of claim 8, wherein the at least one second type of semiconductor device comprises at least one laterally diffused metal oxide semiconductor (LDMOS) detector.

10. The method of claim 8, wherein the at least one second type of semiconductor device comprises at least one transistor, the at least one transistor comprising work-function material in a gate structure.

11. The method of claim 7, further comprising forming a protective layer over the layer of dielectric material prior to removing the at least one portion.

12. The method of claim 7, further comprising:

forming a second blanket dielectric layer over the structure after the removing; and forming a layer of dielectric material over the second blanket dielectric layer above the area of the substrate.

13. The method of claim 7, further comprising, after removing the common portion and before forming the layer of dielectric material, forming a layer of semiconductor material on the area of the substrate such that a top surface of the structure is planar, and wherein forming the layer of dielectric material comprises forming the layer of dielectric material on the layer of semiconductor material.

14. The method of claim 13, wherein forming the layer of semiconductor material comprises forming epitaxial semiconductor material.

15. The method of claim 13, further comprising forming a protective layer over the layer of dielectric material prior to removing the at least one portion.

* * * * *